US012218067B1

(12) United States Patent
Herrault

(10) Patent No.: US 12,218,067 B1
(45) Date of Patent: Feb. 4, 2025

(54) THROUGH-WAFER COAXIAL TRANSITION

(71) Applicant: HRL Laboratories, LLC, Malibu, CA (US)

(72) Inventor: Florian G. Herrault, Malibu, CA (US)

(73) Assignee: HRL LABORATORIES, LLC, Malibu, CA (US)

( * ) Notice: Subject to any disclaimer, the term of this patent is extended or adjusted under 35 U.S.C. 154(b) by 448 days.

(21) Appl. No.: 17/539,116

(22) Filed: Nov. 30, 2021

Related U.S. Application Data

(60) Provisional application No. 63/166,861, filed on Mar. 26, 2021.

(51) Int. Cl.
H01L 23/538 (2006.01)
H01L 23/66 (2006.01)
H01P 5/08 (2006.01)

(52) U.S. Cl.
CPC ...... *H01L 23/5384* (2013.01); *H01L 23/5385* (2013.01); *H01L 23/66* (2013.01); *H01P 5/085* (2013.01)

(58) Field of Classification Search
CPC . H01L 23/5384; H01L 23/5385; H01L 23/66; H01P 5/085
See application file for complete search history.

(56) References Cited

U.S. PATENT DOCUMENTS 9,178,261 B2 11/2015 Boone
10,998,273 B2 5/2021 Herrault
2011/0291287 A1* 12/2011 Wu .................. H01L 21/76898
257/E21.597
2015/0084194 A1 3/2015 Molzer
2022/0071009 A1* 3/2022 LeClair .................. H01L 23/15

OTHER PUBLICATIONS

U.S. Appl. No. 15/228,724, filed Aug. 4, 2016, Herrault.
Chang-Chien, P., et al., "MMIC Packaging and Heterogeneous Integration using Wafer-Scale Assembly" at Northrop Grumman Space Technology, csmantech 2007 conference, pp. 143-146.
Thadesar, P., et al., "Novel Photo—Defined Polymer-Enhanced Through—Silicon Vias for Silicon Interposers," IEEE Transactions on Components, Packaging and Manufacturing Technology, vol. 3, No. 7, Jul. 2013, pp. 1130-1137.
Thadesar, P., et al., "Through-Silicon Vias: Drivers, Performance, and Innovations," IEEE Transactions on Components, Packaging and Manufacturing Technology, vol. 6, No. 7, Jul. 2016, pp. 1007-1017.
https://www.preperm.com/products/raw-materials/ (Printed on Feb. 15, 2022).

\* cited by examiner

*Primary Examiner* — Douglas W Owens
(74) *Attorney, Agent, or Firm* — Ladas & Parry, LLP

(57) ABSTRACT

An electronic assembly, comprising a carrier wafer of a first material, having a top wafer surface and a bottom wafer surface; said carrier wafer comprising a through-wafer cavity having walls that join said top wafer surface to said bottom wafer surface; and an insulator of a second material, different from the first material, having insulator top and bottom surfaces, joined by insulator side surfaces, and having a conducting via that passes through said insulator between said insulator top surface and said insulator bottom surface; wherein the insulator is held in said through-wafer cavity by direct contact of the insulator side surfaces with an attachment metal that fills said through-wafer cavity.

9 Claims, 6 Drawing Sheets

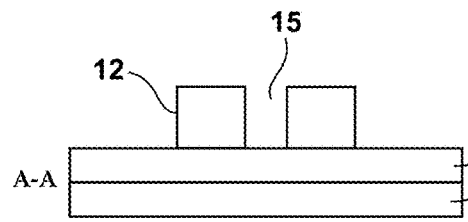
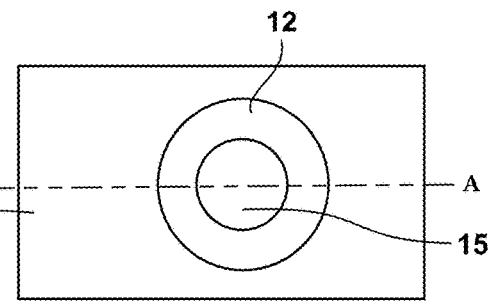
FIG. 1A  FIG. 1B
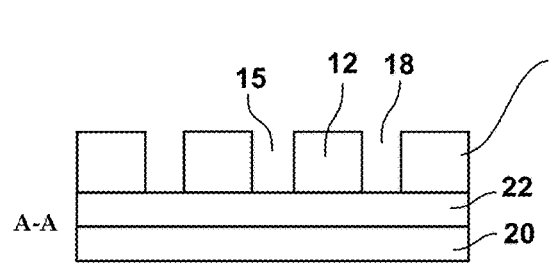
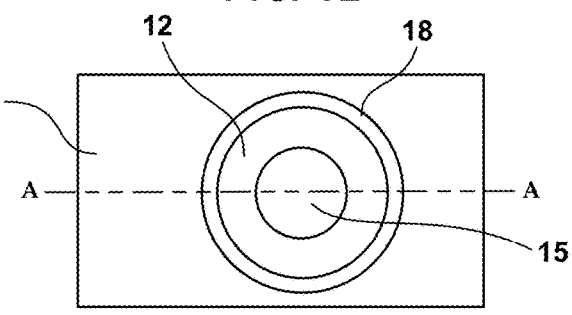
FIG. 1C  FIG. 1D
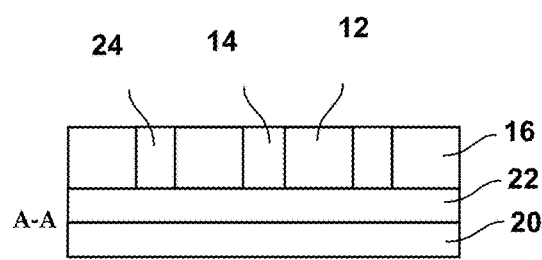
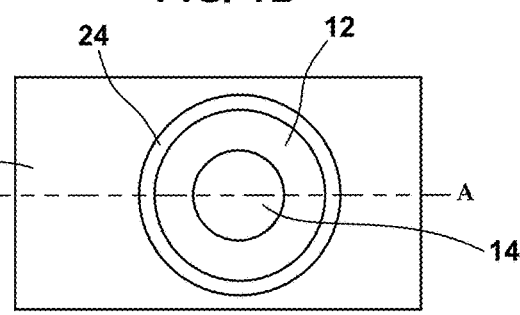
FIG. 1E  FIG. 1F
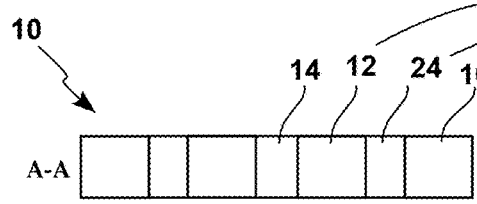
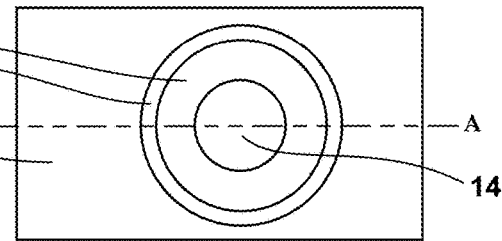
FIG 1G  FIG. 1H

THROUGH-WAFER COAXIAL TRANSITION

CROSS REFERENCE TO RELATED APPLICATIONS

This application is related to and claims priority from U.S. application Ser. No. 63/166,861, filed on Mar. 26, 2021, which is incorporated by reference herein as though set forth in full.

STATEMENT REGARDING FEDERAL FUNDING

This invention was made with the U.S Air Force support under Contract No. FA8650-13-C-7324 and with the support of the Defense Advanced Research Projects Agency (DARPA) under Contract No. HR0011-19-C-0006. The U.S. Government has certain rights in the invention.

TECHNICAL FIELD

Embodiments of this presentation relate to electronic assemblies comprising a through-wafer coaxial transition. This presentation more particularly refers to the architecture and fabrication of through-substrate coaxial interconnects for RF applications using high-performance dielectrics (e.g., low k dielectric with low loss tangent). Embodiments of this presentation also comprise methods of manufacturing such electronic assemblies.

BACKGROUND

Many attempts were made in the past to manufacture through-wafer coaxial connection structures. U.S. Pat. No. 9,178,261 discloses through wafer coax with c-shaped ground. The technology of this patent cannot do a "closed ring" design because the center piece would fall off in their approach. Further, the technology of this patent uses the same dielectric for the coax as the rest of the wafer (typically silicon, which creates detrimental technical limitations.

The reference: IEEE TRANSACTIONS ON COMPONENTS, PACKAGING AND MANUFACTURING TECHNOLOGY, VOL. 3, NO. 7, July 2013 entitled: "Novel Photo-Defined Polymer-Enhanced Through-Silicon Vias for Silicon Interposers discloses photodefinable dielectrics using a limited material set; and also provide for coax structures with not fully enclosed ground rings.

The reference: IEEE TRANSACTIONS ON COMPONENTS, PACKAGING AND MANUFACTURING TECHNOLOGY, VOL. 6, NO. 7, July 2016 1007 "Through-Silicon Vias: Drivers, Performance, and Innovations" discloses provide for coax structures with not fully enclosed ground rings, using array of ground/signal vias.

US patent application publication No. 2015/0084194A1 discloses via for radio frequency antenna connections related to a package. In one example, a package has a package substrate, a die attached to the package substrate, and a conductive via from the package substrate to an external surface of the package to make a radio frequency connection between the antenna and the package substrate.

Inventors P. Chang-Chien, et al. described MMIC Packaging and Heterogeneous Integration using Wafer-Scale Assembly at a Northrop Grumman Space Technology, csmantech 2007 conference. Their paper demonstrated through-wafer coax topologies with metallic conductors, but also used silicon as a dielectric material. The silicon has high dielectric constant, and is a lossy material.

There exists a need for high performance through-wafer coaxial connections.

SUMMARY

Embodiments of this presentation comprise using HRL's Proprietary Metal-Embedded Chip Assembly (MECA) and Metal-Embedded Chiplet Assembly for Microwave Integrated Circuits (MECAMIC) technology, which relies on the integration of chips/chiplets/components into the volume of wafers via an electroformed metal anchoring approach. The metal provides structural mechanical integrity to the combination of chiplets and interposer wafer, as well as DC and RF electrical ground.

According to embodiments of this presentation, a dielectric ring chiplet is integrated into a MECA/MECAMIC process, whereby the dielectric ring chiplet forms a fully-enclosed through-substrate coaxial interconnect. Such coaxial interconnects can use a dielectric material different from the material of the interposer wafer and have superior performance (characteristic impedance range, loss, size) over known integrated coaxial interconnects. Thus, embodiments of this presentation comprise through-wafer RF interconnects with desirable performance, using superior dielectric materials and fully-enclosed ground rings. According to embodiments of this presentation, the design of the coaxial interconnect can be completely independent from the characteristics of the surrounding wafer material, which offers significant advantages for manufacturing.

Further, embodiments of this presentation can be co-fabricated with a backside ground plane in one single step, providing backside ground and through wafer signal conductors.

Embodiments of this presentation can be used for 3D integration as a coax-interconnect in a reconstructed wafer.

Embodiments of this presentation comprise a chiplet made from a dielectric material with a top surface and a bottom surface, and at least one inner sidewall and one outer sidewall connected from top to bottom; said chiplet forming a conductive coaxial interconnect when embedded into another substrate with a cavity having a sidewall in direct contact with a metal directly contacting the outer sidewall of the chiplet, the inner sidewall of the chiplet also being metalized simultaneously with the forming of metal contacting the outer sidewall of the chiplet.

According to embodiments of this presentation, said chiplet can be connected to another chip by a conductor from one top pad on the chiplet to another top pad on the other chip.

Embodiments of this presentation comprise a chiplet made from a dielectric material with a top surface and a bottom surface, and at least one inner sidewall and one outer sidewall connected from top to bottom; said chiplet forming a conductive coaxial interconnect when embedded into another substrate with a cavity where the sidewall is in direct metallic contact with the outer sidewall of the chiplet, the inner sidewall of the chiplet also being metalized simultaneously; said chiplet being thicker than the other substrate; said substrate being backside metalized during the chiplet metallization process.

An embodiment of this presentation comprises an electronic assembly, comprising: a carrier wafer of a first material, having a top wafer surface and a bottom wafer surface; said carrier wafer comprising a through-wafer cavity having walls that join said top wafer surface to said bottom wafer surface; and an insulator of a second material different from the first material, having insulator top and bottom surfaces, joined by insulator side surfaces, and having a conducting via that passes through said insulator between said insulator top surface and said insulator bottom surface; wherein the insulator is held in said through-wafer cavity by direct contact of the insulator side surfaces with an attachment metal that fills said through-wafer cavity. According to an embodiment, the insulator can be rotationally symmetrical with respect to an axis passing through a center of the conducting via. According to an embodiment, the carrier wafer can include integrated circuits (active or passive) on its top or bottom surfaces, and/or be made of any substrate material (e.g., Si CMOS, SiGe, GaAS, GaN on SiC, SiC, etc.).

According to an embodiment of this presentation, the carrier wafer and the insulator have a same thickness.

According to an embodiment of this presentation, the insulator is thicker than the carrier wafer, the top surface of the insulator and the carrier wafer being flush and the bottom surface of the insulator protruding out of the bottom surface of the carrier wafer, and said attachment metal further covers at least a portion of the bottom surface of the carrier wafer around the through-wafer cavity. According to an embodiment of this presentation, a bottom surface of the attachment metal covering at least a portion of the bottom surface of the carrier wafer can be flush with the bottom surface of the insulator. According to an embodiment of this presentation, the bottom surface of the attachment metal covering at least a portion of the bottom surface of the carrier wafer can be made flush with the bottom surface of the insulator by polishing.

According to an embodiment of this presentation, the electronic assembly further comprises a component chip having a top surface and a bottom surface joined by chip side surfaces, said component chip being held in said through-wafer cavity by direct contact of said chip side surfaces with said attachment metal.

According to an embodiment of this presentation, the top surfaces of said carrier wafer, insulator and component chip are flush; and a conductor formed above said top surfaces electrically connects a top portion of said conducting via to a contact pad on the top surface of said component chip.

According to an embodiment of this presentation, the top surfaces of said carrier wafer, insulator and component chip are flush and the carrier wafer is thicker than the component chip; wherein said attachment metal fills the through-wafer cavity below the bottom surface of the component chip.

According to an embodiment of this presentation, the electronic assembly comprises a first component chip having a first contact pad on a first component chip bottom surface; said first contact pad being electrically connected to a top portion of said conducting via; and a second component chip having a second contact pad on a second component chip top surface; said second contact pad being electrically connected to a bottom portion of said conducting via.

According to an embodiment of this presentation, said first contact pad is press bonded to said top portion of said conducting via; and said second contact pad is press bonded to said bottom portion of said conducting via.

According to an embodiment of this presentation, said first contact pad is ball bonded to said top portion of said conducting via; and said second contact pad is ball bonded to said bottom portion of said conducting via.

According to an embodiment of this presentation, the electronic assembly further comprises a component chip having a top surface and a bottom surface joined by chip side surfaces, said component chip being held in a second through-wafer cavity by direct contact of said chip side surface with a second attachment metal filling said second through-wafer cavity.

Other embodiments of this presentation comprise a method of manufacturing an electronic assembly that includes: providing a carrier wafer of a first material, having a top wafer surface and a bottom wafer surface; said carrier wafer comprising a through-wafer cavity having walls that join said top wafer surface to said bottom wafer surface; providing an insulator of a second material distinct from the first material, having insulator top and bottom surfaces, joined by insulator side surfaces, and having a through-insulator hole that passes through said insulator between said insulator top surface and said insulator bottom surface; attaching the top wafer surface to a support wafer and attaching the top insulator surface to said support wafer in said through-wafer cavity; filling-up the through wafer cavity as well as the through-insulator hole with an attachment metal; and removing the support wafer from the top surfaces of the carrier wafer and the insulator. According to an embodiment of this presentation, the insulator can be rotationally symmetrical with respect to an axis passing through a center of the through-insulator hole. According to an embodiment of this presentation, the carrier wafer can include integrated circuits (active or passive) on its top or bottom surfaces, and/or be made of any substrate material (e.g., Si CMOS, SiGe, GaAS, GaN on SiC, SiC, etc.). According to an embodiment, the insulator can be glass.

According to an embodiment of this presentation, the carrier wafer and the insulator have a same thickness.

According to an embodiment of this presentation, the insulator is thicker than the carrier wafer, and said filling the through wafer cavity as well as the through-insulator hole with an attachment metal comprises covering the bottom wafer surface with a layer of said attachment metal; the method further comprising patterning said layer of said attachment metal on the bottom wafer surface. According to an embodiment of this presentation, a bottom surface of the attachment metal covering at least a portion of the bottom surface of the carrier wafer can be flush with the bottom surface of the insulator. According to an embodiment of this presentation, the bottom surface of the attachment metal covering at least a portion of the bottom surface of the carrier wafer can be made flush with the bottom surface of the insulator by polishing.

According to an embodiment of this presentation, the method further comprises providing a component chip having a top surface and a bottom surface joined by chip side surfaces, and attaching the top chip surface to said support wafer in said through-wafer cavity before filling-up the through wafer cavity as well as the through-insulator hole with the attachment metal.

According to an embodiment of this presentation, the method further comprises, after removing the support wafer from the top surfaces of the carrier wafer, the component chip and the insulator, forming a conductor above said top surfaces to electrically connect a top portion of the attachment metal in the through-insulator hole to a contact pad on the top surface of said component chip.

According to an embodiment of this presentation, the carrier wafer is thicker than the component chip; and said filling-up the through wafer cavity as well as the through-insulator hole with the attachment metal comprises filling the through-wafer cavity below the bottom surface of the component chip with the attachment metal.

According to an embodiment of this presentation, the method further comprises: providing a first component chip having a first contact pad on a first component chip bottom surface; providing a second component chip having a second contact pad on a second component chip top surface; said second contact pad being electrically connected to a bottom portion of said conducting via; and after filling-up the through wafer cavity as well as the through-insulator hole with an attachment metal and removing the support wafer from the top surfaces of the carrier wafer and the insulator: electrically connecting said first contact pad to a top portion of the attachment metal in the through-insulator hole; and electrically connecting said second contact pad to a bottom portion of the attachment metal in the through-insulator hole.

According to an embodiment of this presentation, said electrically connecting said first contact pad to a top portion of the attachment metal in the through-insulator hole and said electrically connecting said second contact pad to a bottom portion of the attachment metal in the through-insulator hole comprises: press bonding said first contact pad to said top portion of the attachment metal in the through-insulator hole; and press bonding said second contact pad to said bottom portion of the attachment metal in the through-insulator hole.

According to an embodiment of this presentation, said electrically connecting said first contact pad to a top portion of the attachment metal in the through-insulator hole and said electrically connecting said second contact pad to a bottom portion of the attachment metal in the through-insulator hole comprises: ball bonding said first contact pad to said top portion of the attachment metal in the through-insulator hole; and ball bonding said second contact pad to said bottom portion of the attachment metal in the through-insulator hole.

This Summary is provided to introduce a selection of concepts in a simplified form that are further described below in the Detailed Description. This summary is not intended to identify key features or essential features of the claimed subject matter, nor is it intended to be used to limit the scope of the claimed subject matter.

BRIEF DESCRIPTION OF THE DRAWINGS

FIGS. 1A, 1C, 1E and 1G illustrate a cross-section (along a line A-A) of portions of an electronic assembly according to embodiments of this presentation while the electronic assembly is manufactured.

FIGS. 1B, 1D, 1F and 1H show top views of the electronic assembly portions shown in FIGS. 1A, 1C, 1E and 1G.

DETAILED DESCRIPTION OF EMBODIMENTS

Figure 2A:
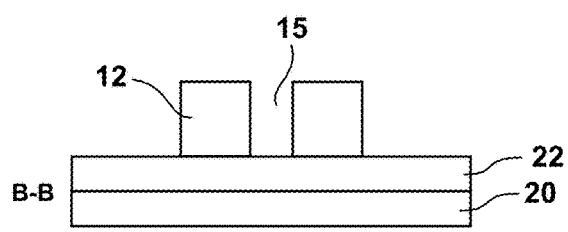
FIGS. 2A, 2C, 2E and 2G illustrate a cross-section (along a line B-B) of portions of an electronic assembly according to embodiments of this presentation while the electronic assembly is manufactured.
Figure 2B:
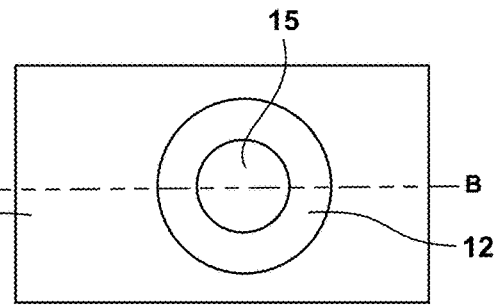
FIGS. 2B, 2D, 2F and 2H show top views of the electronic assembly portions shown in FIGS. 2A, 2C, 2E and 2G.

In the following detailed description, reference is made to the accompanying drawings which form a part hereof, and in which are shown by way of illustration specific embodiments in which the invention may be practiced. These embodiments are described in sufficient detail to enable those skilled in the art to practice the invention, and it is to be understood that other embodiments may be utilized and that structural, logical and electrical changes may be made without departing from the spirit and scope of the invention. The following detailed description is therefore not to be taken in a limiting sense, and the scope of the invention is defined only by the appended claims and equivalents thereof. Like numbers in the figures refer to like components, which should be apparent from the context of use.

Embodiments of this presentation permit a manufacturing approach where the design of the coax transition is completely decoupled from the substrate into which it is integrated. This provides significant design flexibility (the dielectric material can be selected for best performance, independently of the wafer substrate) and potential performance improvement and size reduction.

By leveraging HRL's proprietary MECA integration technology, disclosed for example in U.S. application Ser. No. 16/158,212, embodiments of this presentation provide for creating through-substrate coaxial interconnects with high-performance dielectrics. To do so, embodiments of this presentation provide to use chiplets made of a dielectric or insulator material, as detailed hereafter. For RF performance, glass is a good choice for the chiplets, but there are other less common materials that can now be leveraged in this technology, such as products sold under the brand name "PREPERM", such as "PPE260", "PPE300", "PPE320", "PPE350", "PPE400", "PPE440", "PPE500", "PPE650", "PPE800", "PPE950", "PPE1200", etc. . . . .

As illustrated in FIGS. 1A-1H, an electronic assembly 10 according to embodiments of this presentation can comprise a chiplet 12 that consists of an annular ring that is micro-fabricated through standard techniques such as dry etching or laser micromachining. The dielectric/insulator chiplets 12 are hereafter called ring chiplet, but other outer geometries can be designed and fabricated such as squares and rectangles or polygonal cylinders. Similarly, an inner, through-insulator-via 14 (see FIGS. 1E, 1F) passes in an axial lumen 15 of ring/chiplet 12. Via 14 is generally of circular radial cross-section, but it can also be another shape.

According to embodiments of this presentation, an interposer wafer 16 (also called body wafer, MECA (MIC) wafer, cavity wafer, or any other related term) can be pre-fabricated with a through-wafer cavity 18. The interposer wafer 16 can also include integrated circuits and/or passive circuits, and be made of any substrate material (e.g., Si CMOS, SiGe, GaAS, GaN on SiC, SiC, etc.).

As illustrated hereafter for example in FIGS. 1A, 1B, according to embodiments of this presentation a top surface of ring chiplet 12 (flipped upside down) is attached on a temporary carrier wafer 20 using a layer 22 of temporary adhesive. As illustrated for example in FIGS. 1C, 1D, a top surface of the MECA wafer 16 (flipped upside down) is also temporarily attached on the temporary carrier wafer 20 with the adhesive layer 22, such that the ring chiplet 12 is arranged (for example centered) in the through-wafer recess 18 of the MECA wafer 16 and such that the outer walls of the ring chiplet 12 do not touch the inner walls of recess 18. Subsequently, and as illustrated in FIGS. 1E, 1F metal is deposited in the through-wafer recess 18 and in the ring lumen 15, for example by electroplating so as to: a/attach (with metal 24) the chiplet 12 to the sidewall of the through-wafer recess 18 of the MECA wafer 16; and b/fill ring lumen 15 with metal (metal 14), thus forming a through-insulator-via traversing axially ring chip 12. Optionally, excess metal formed above the surfaces of wafer 16 and chiplet 12 can be removed, for example using a polishing operation. The above steps can use the standard MECA/MECAMIC process, but they additionally provide a particular electrical feature according to this presentation. Indeed, the combination of via 14 surrounded by dielectric chiplet 12, surrounded continuously by metal 24, forms a vertical coaxial interconnect structure with low loss dielectric. According to embodiments of this presentation, the inner metal via 14 now formed in the center of the ring chiplet 12 forms a signal conductor of the coaxial interconnect structure, while the metal 24 filling the through-wafer recess 18 around the ring chiplet 12 provides a gapless RF ground conductor of the coaxial interconnect structure. FIG. 1F illustrates a view of the bottom surface of the electronic assembly 10 (flipped upside down) according to this presentation, which comprises the metal-filled ring chiplet 12 embedded in the metal 24 that fills the recess of MECA wafer 16, after polishing of said bottom surface.

As illustrated in FIGS. 1G and 1H, once the metal (24, 14) attaches the ring chip 12 to the MECA wafer 16 and fills the lumen 15; and for example after polishing the bottom surface of the electronic assembly 10, the attached ring chiplet 12 and MECA wafer 16 are detached from carrier wafer 20. The freed top surfaces of the attached ring chiplet 12 and MECA wafer 16 can then be polished for example in the same way as the bottom surfaces. FIG. 1H illustrates a view of the top surface of a portion of assembly 10, comprising the filled ring chiplet 12 and the MECA wafer 16 attached together by metal 24.

According to embodiments of this presentation, the metallization process can be done in multiple ways (e.g., metal fill/infiltration). For RF interconnects at frequencies up to the W-band, the chiplet 12 inner diameter can be of the order of 5 to 50 μm, and its outer diameter can be between 50 and 500 μm, even though it is directly correlated to the dielectric constant of the selected material. According to embodiments of this presentation, the coaxial interconnect structure using chiplet 12 is arranged to have a 50 Ohm characteristic impedance. According to embodiments of this presentation, the thickness of wafer 16 can range from 0.01 nm to 1.00 nm.

The feature of having an insulator/dielectric material in the coaxial structure, between the center conductor and the surrounding conductor, in a material different from the material of the interposer wafer, is particularly advantageous because it completely decouples the performance of the coaxial transition from the substrate wafer material (in many prior art cases, silicon is used as a substrate material. If used as the dielectric for a coax design, silicon is very lossy, and results in very large designs to maintain 50 Ohm characteristic impedance due to the high dielectric constant of silicon).

As illustrated in FIGS. 1G, 1H, the electronic assembly 10 manufactured according to embodiments of this presentation comprises: a/carrier wafer 16 of a first material, having a top wafer surface and a bottom wafer surface, wherein carrier wafer 16 comprises a through-wafer cavity 18 having walls that join said top wafer surface to said bottom wafer surface; and b/an insulator 12 of a second material different from the first material, having insulator top and bottom surfaces, joined by insulator side surfaces, and having a conducting via 14 that passes through said insulator 12 between said insulator top surface and said insulator bottom surface; wherein the insulator 12 is held in said through-wafer cavity 18 by direct contact of the insulator side surfaces with an attachment metal 24 that fills said through-wafer cavity 18.

It is noted that alternatively to the steps detailed above, the chiplet 12 can be attached to the temporary wafer 20 after the cavity wafer 16 and not before it.

FIGS. 2A to 2H illustrate an electronic assembly 10' according to embodiments of this presentation, wherein a modified approach enables a co-design and fabrication of a ground plane on the back of the MECA wafer 16. This is made possible for example if the chiplet 12 is thicker than the MECA wafer. Most ground planes are on the order of 2 to 5 μm thick. This is done without adding any processing step, which is particularly advantageous.

Figure 2C:
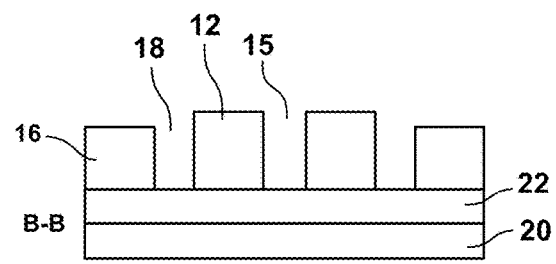
Figure 2D:
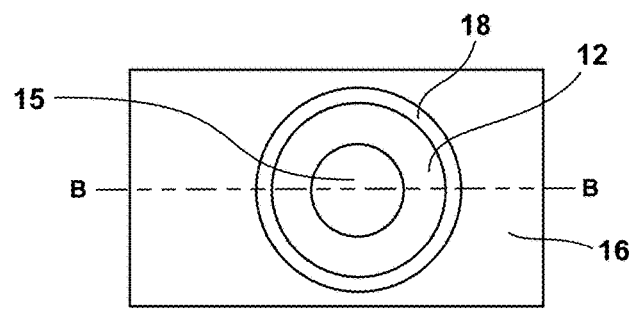
Figure 2E:
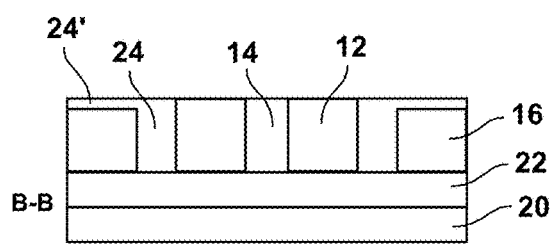
Figure 2F:
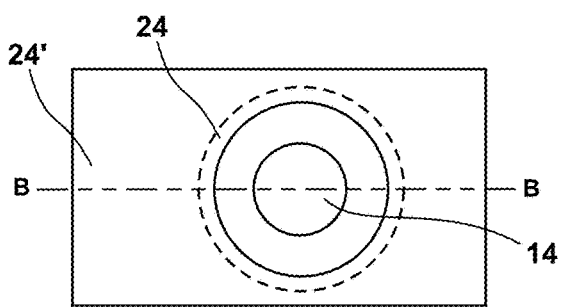

FIGS. 2A to 2H show structures identical to those shown in FIGS. 1A to 1H, except that in FIGS. 1A to 1H the chiplet/ring 12 has the same height as the cavity wafer 16, whereas in FIGS. 2A to 2H, the chiplet/ring 12 is higher than the cavity wafer 16. It follows that, as shown in FIG. 2C (which is flipped upside down for manufacturing), after attaching the top surfaces of ring 12 and wafer 16 to carrier wafer 20, the bottom surface of chip 12 protrudes beyond the bottom surface of wafer 16. It follows from this height discrepancy that after filling recess 18 and 15 with metal, and polishing the metal flush with the bottom surface of chiplet/ring 12, a portion 24' of the metal 24 that fills recess 18 extends on the bottom surface of wafer 16 beyond the inner walls of recess 18, as illustrated in FIGS. 2E, 2F. According to an embodiment of this presentation, the metal 24' that covers the bottom surface of wafer 16 can be used for electrical connection of the ground conductor of the coaxial interconnect structure while at the same time acting as radiator or heat sink to cool down the coaxial interconnect structure. According to an embodiment (not shown) of this presentation, a portion of the metal 24' covering the bottom surface of wafer 16 can be etched away.

Figure 2G:
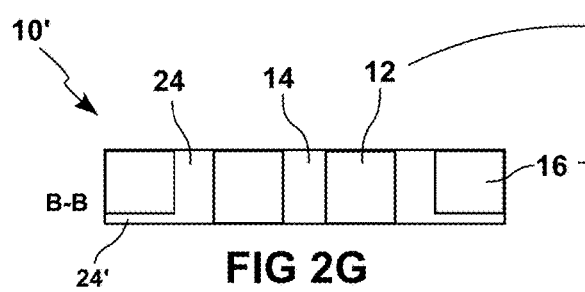
Figure 2H:
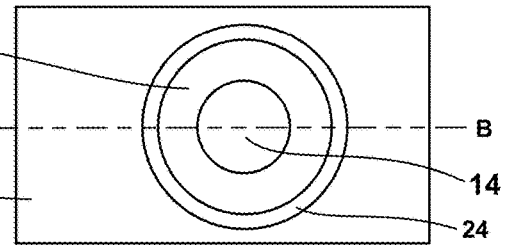

FIGS. 2G, 2H show the electronic assembly 10', after the top surfaces of chiplet 12 and wafer 16 have been detached from carrier wafer 20 and the top surfaces of chiplet 12, wafer 16 and of the metal (24, 14) in cavity 18 and lumen 15 have optionally been polished to make them flush, consistently with the embodiment previously described.

Figure 3A:
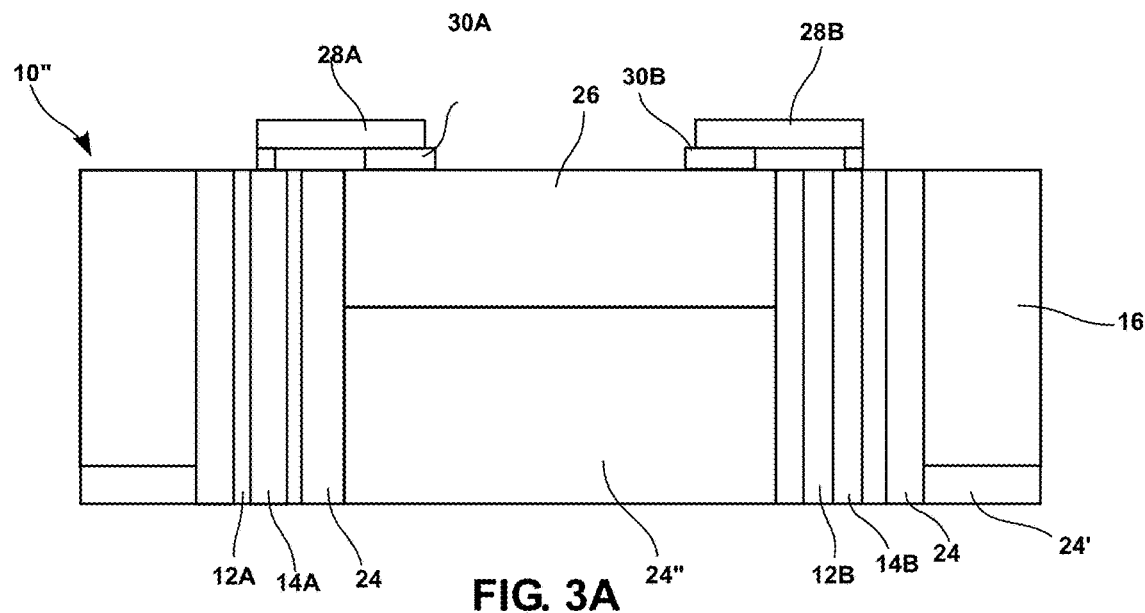
FIG. 3A illustrates a cross section of an electronic assembly according to embodiments of this presentation.
Figure 3B:
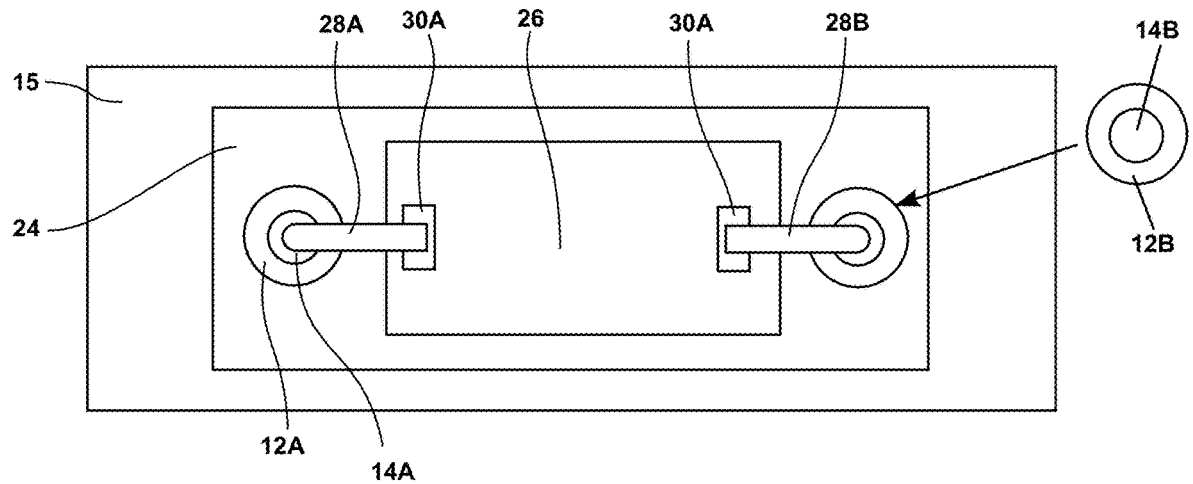
FIG. 3B is a top view of the electronic assembly of FIG. 3A.

FIGS. 3A and 3B respectively show a cross-section view and a top view of portions of an electronic assembly 10" according to embodiments of this presentation, where two chiplet/rings/insulators 12A, 12B (for example identical each to chiplet/ring/insulator 12 of FIGS. 2A-2H) as well as one component chip 26 are held in one cavity 18 of wafer 16 by metal 24. According to embodiments of this presentation, component chip 26 has a top surface and a bottom surface joined by chip side surfaces and is held in through-wafer cavity 18 by direct contact of said chip side surface with metal 24. Such an assembly allows to connect component chip 26 to components (not shown) arranged on the bottom surface of wafer 16 using coaxial connections of reduced size and having a desired impedance; for example 50 Ohm.

According to embodiments of this presentation, the top surfaces of carrier wafer 16, chiplets 12A, 12B and component chip 26 are flush, and at least one conductor (two illustrated: 28A, 28B), formed above said top surfaces, electrically connects a top portion of the conducting via (two illustrated; 14A, 14B in the figure) to a contact pad (two illustrated; 30A, 30B in the figure) on the top surface of component chip 26. As illustrated in FIG. 3A, component chip 26 can have a height smaller than the height of wafer 16, in which case the space between the bottom surface of component chip 26 and the bottom surface of electronic assembly 10" can be filled with a volume 24" of metal 24. As in the embodiment illustrated in FIGS. 2A-2H, the two chiplet/rings/insulators 12A, 12B have a height larger than the height of wafer 16 and a portion 24' of metal 24 extends over the back surface of wafer 1. Said portion 24' can for example be used to form a shielding ground plane.

Figure 4A:
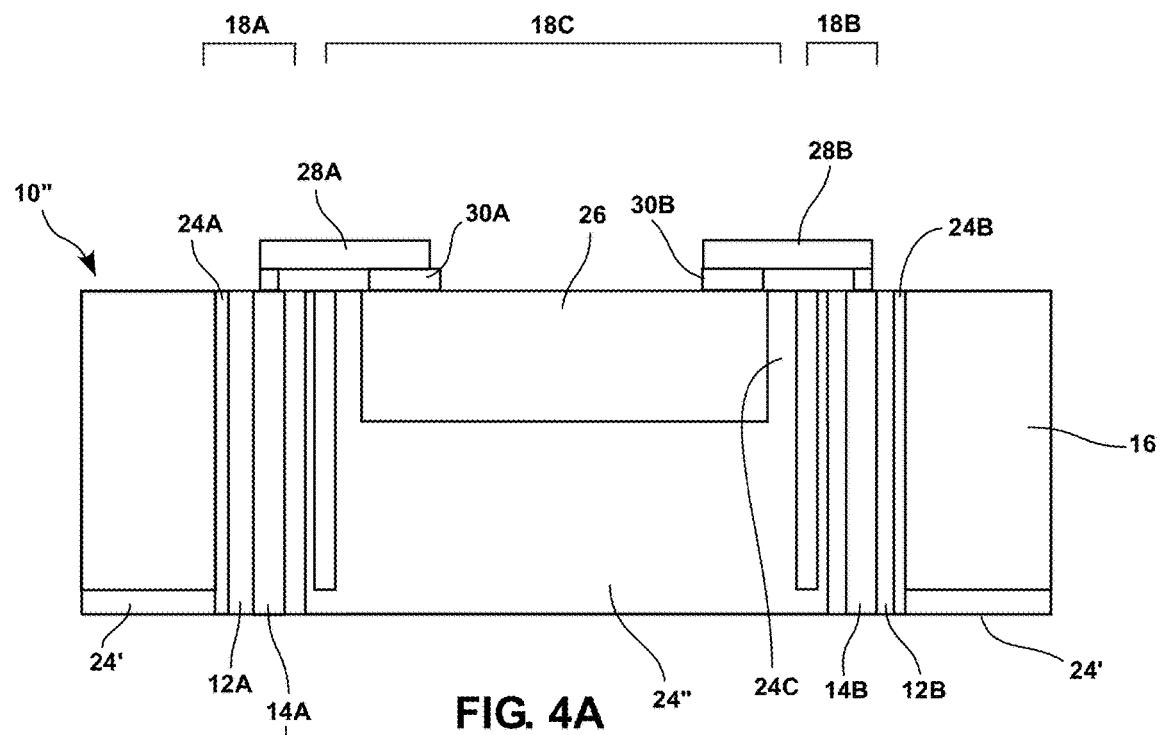
FIG. 4A illustrates a cross section of an electronic assembly according to embodiments of this presentation.
Figure 4B:
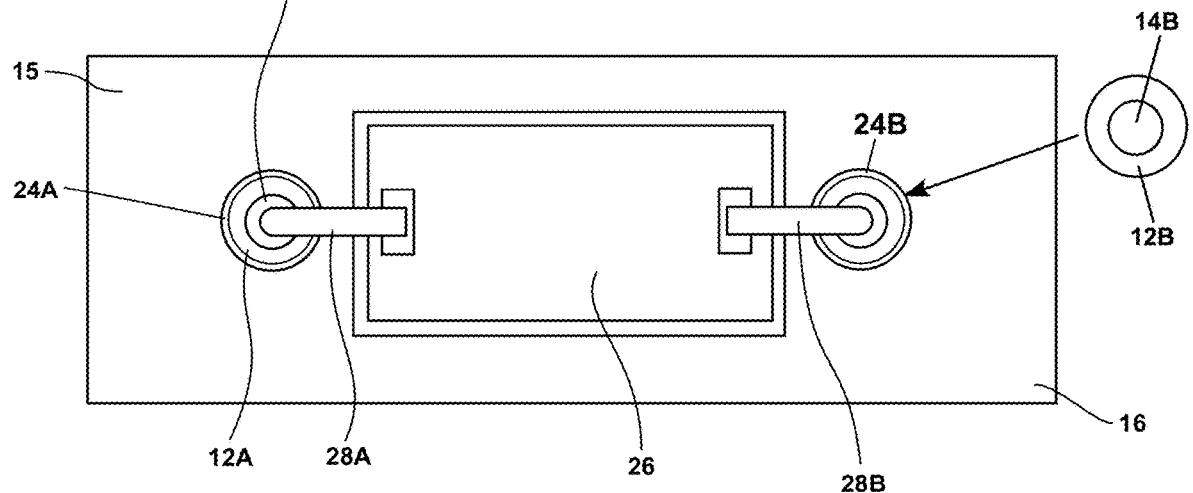
FIG. 4B is a top view of the electronic assembly of FIG. 4A.

FIGS. 4A and 4B show a cross-section view and a top view, respectively, of portions of an electronic assembly 10''' according to embodiments of this presentation where two chiplet/rings/insulators 12A, 12B (for example identical each to chiplet/ring/insulator 12 of FIGS. 2A-2H) as well as one component chip 26 are held each in a cavity (respectively, 18A, 18B, 18C) of wafer 16 by metal 24 (24A, 24B, 24C, respectively). According to embodiments of this presentation, component chip 26 has a top surface and a bottom surface joined by chip side surfaces and is held in through-wafer cavity 18 by direct contact of said chip side surface with the metal 24C that fills cavity 18C.

According to embodiments of this presentation, the top surfaces of carrier wafer 16, chiplets 12A, 12B and component chip 26 are flush; and at least one conductor (two illustrated: 28A, 28B), formed above said top surfaces, electrically connects a top portion of the conducting via (two illustrated; 14A, 14B in the figure) to a contact pad (two illustrated; 30A, 30B in the figure) on the top surface of component chip 26. As illustrated in FIG. 4A, component chip 26 can have a height smaller than the height of wafer 16, in which case the space between the bottom surface of component chip 26 and the bottom surface of electronic assembly 10" can be filled with a volume 24" of metal 24C. As in the embodiment illustrated in FIGS. 2A-2H, the two chiplet/rings/insulators 12A, 12B have a height larger than the height of wafer 16 and a portion 24'*of* metal 24 extends over the back surface of wafer 1. Said portion 24' can for example be used to form a shielding ground plane.

Figure 5:
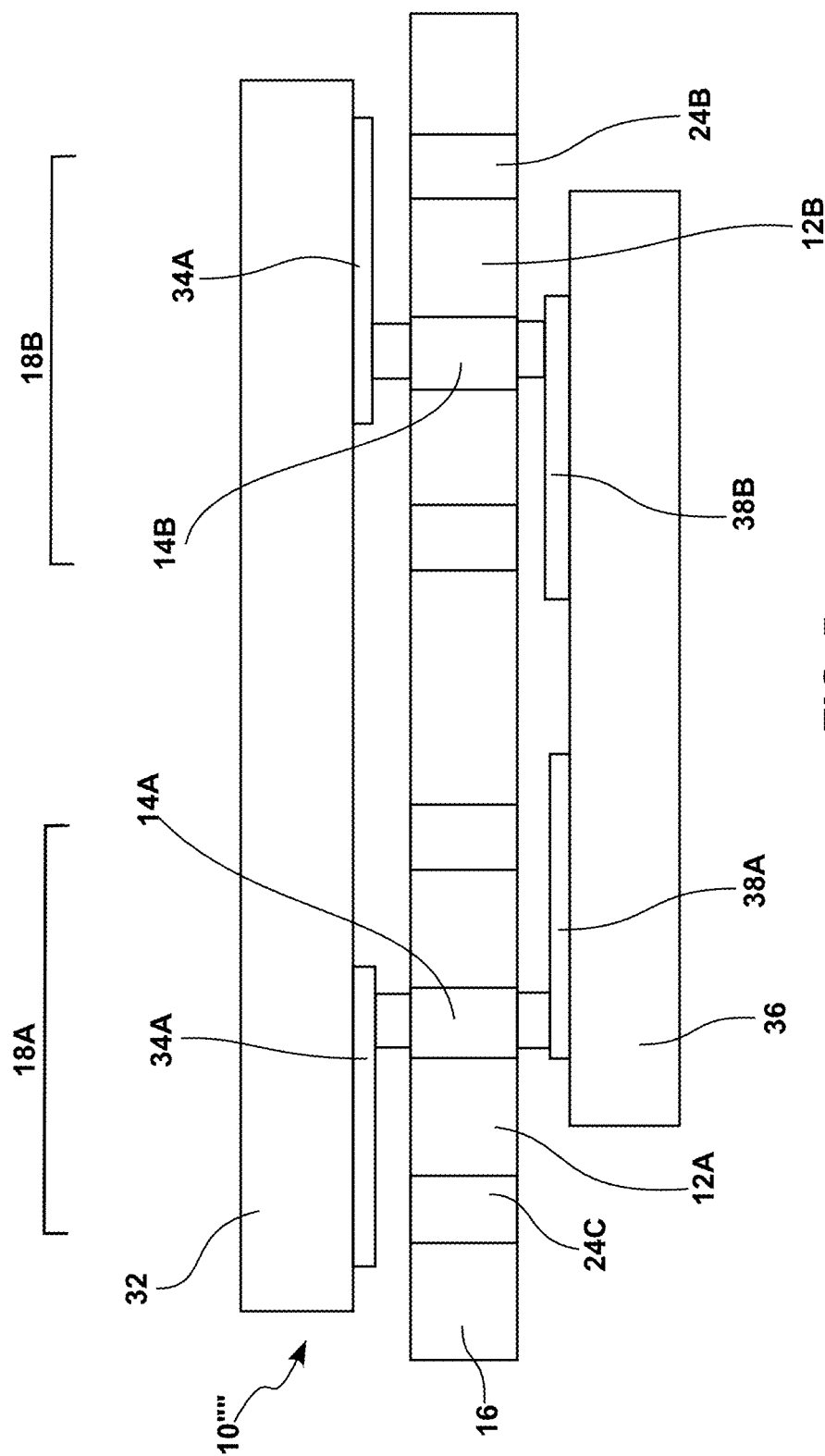
FIG. 5 illustrates a cross section of an electronic assembly according to embodiments of this presentation.

FIG. 5 shows a cross-section of a portion of an electronic assembly 10'''' according to embodiments of this presentation where two chiplet/rings/insulators 12A, 12B (for example identical each to chiplet/ring/insulator 12 of FIGS. 1A-1H) are held each in a distinct cavity (respectively 18A, 18B) of wafer 16 by metal 24 (24A, 24B, respectively)). According to embodiments of this presentation, a first component chip 32 has a top surface and a bottom surface having at least one contact pad (34A, 34B illustrated) on the bottom surface, where said contact pad 34A, 34B is electrically connected to a top portion of the conducting via (14A, 14B) at the center of the chiplet/ring/insulator (12A, 12B). A second component chip 36, having at least one contact pad (two illustrated; 38A, 38B) on its top surface; said at least one contact pad 38A, 38B being electrically connected to a bottom portion of said conducting via (14A, 14B). As illustrated in FIG. 5, embodiments of this presentation allow connecting together chips (32, 36) arranged on both side of substrate 16 with coaxial connections.

Coaxial transitions such as illustrated in FIG. 5 can be used for high-speed low loss RF transitions in 3D die/wafer stacking. The assembly of the top and bottom circuit pads to the vias of the coaxial connection structures can for example be made by press bonding or ball bonding.

Figure 6:
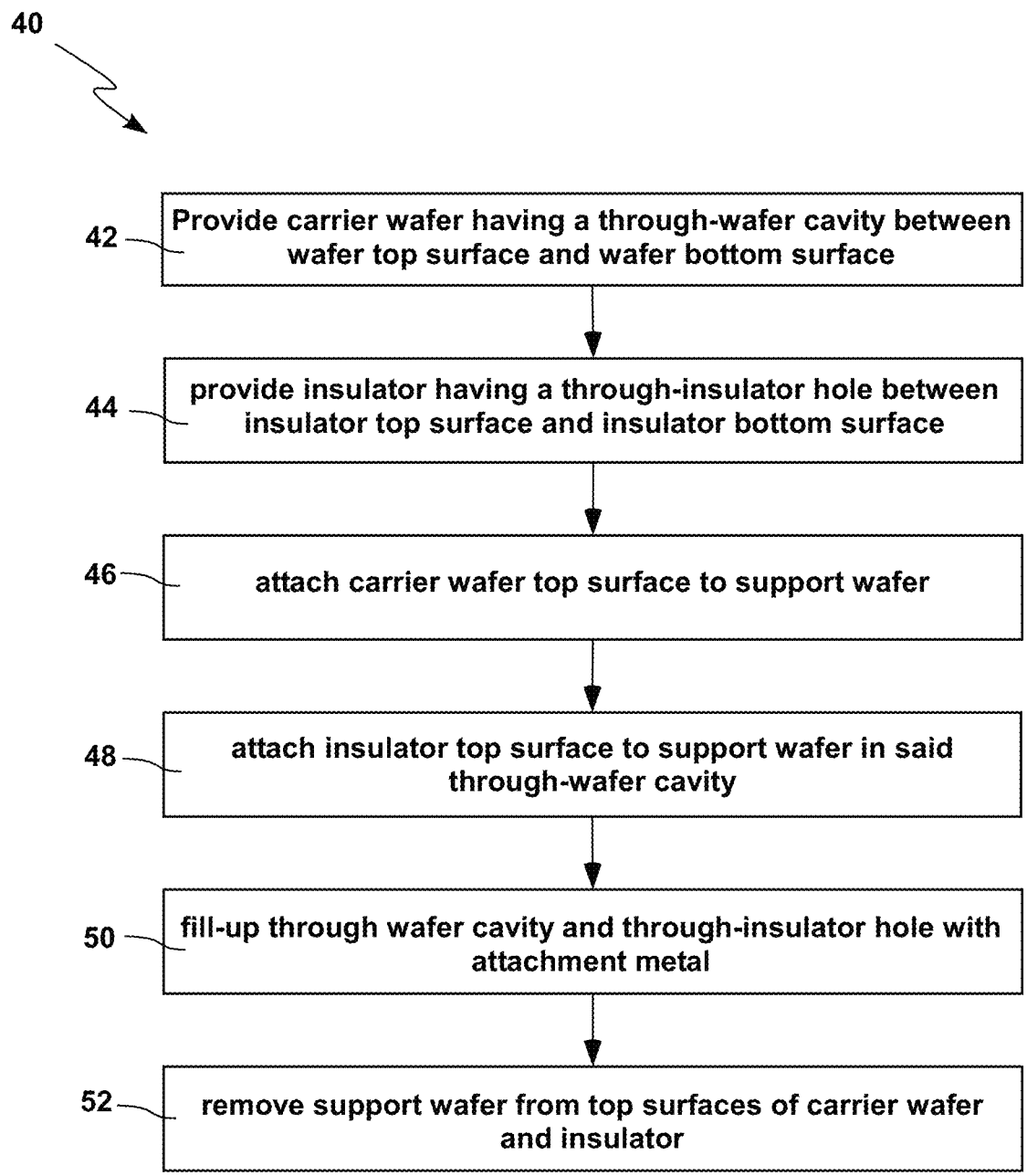
FIG. 6 is a flow chart illustrating a method according to embodiments of this presentation.

FIG. 6 is a flow chart illustrating a method 40 according to embodiments of this presentation, the method comprising: providing 42 a carrier wafer of a first material having a top wafer surface and a bottom wafer surface; said carrier wafer comprising a through-wafer cavity having walls that join said top wafer surface to said bottom wafer surface;

providing 44 an insulator of a second material, different form the first material, having insulator top and bottom surfaces, joined by insulator side surfaces, and having a through-insulator hole that passes through said insulator between said insulator top surface and said insulator bottom surface;

attaching 46 the top wafer surface to a support wafer and attaching 48 the top insulator surface to said support wafer in said through-wafer cavity;

filling-up 50 the through wafer cavity as well as the though insulator hole with an attachment metal; and removing 52 the support wafer from the top surfaces of the carrier wafer and the insulator. As detailed above, steps 46 and 48 for example can be inverted.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom.

Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising the step(s) of . . . ."

The invention claimed is:

1. An electronic assembly, comprising: a carrier wafer of a first material, having a top wafer surface and a bottom wafer surface; said carrier wafer comprising a through-wafer cavity having walls that join said top wafer surface to said bottom wafer surface; and an insulator of a second material, different from the first material, having insulator top and bottom surfaces, joined by insulator side surfaces, and having a conducting via that passes through said insulator between said insulator top surface and said insulator bottom surface; wherein the insulator is held in said through-wafer cavity by direct contact of the insulator side surfaces with an attachment metal that fills said through-wafer cavity; the electronic assembly further comprising a component chip having a top surface and a bottom surface joined by chip side surfaces, said component chip being held in said through-wafer cavity by direct contact of said chip side surface with said attachment metal.

2. The electronic assembly of claim 1, wherein the carrier wafer and the insulator have a same thickness.

3. The electronic assembly of claim 1, wherein the top surfaces of said carrier wafer, insulator and component chip are flush; and wherein a conductor formed above said top surfaces electrically connects a top portion of said conducting via to a contact pad on the top surface of said component chip.

4. The electronic assembly of claim 1, wherein the top surfaces of said carrier wafer, insulator and component chip are flush and where the carrier wafer is thicker than the component chip; wherein said attachment metal fills the through-wafer cavity below the bottom surface of the component chip.

5. The electronic assembly of claim 1, comprising: a first component chip having a first contact pad on a first component chip bottom surface; said first contact pad being electrically connected to a top portion of said conducting via; and a second component chip having a second contact pad on a second component chip top surface; said second contact pad being electrically connected to a bottom portion of said conducting via.

6. The electronic assembly of claim 5, wherein said first contact pad is press bonded to said top portion of said conducting via; and said second contact pad is press bonded to said bottom portion of said conducting via.

7. The electronic assembly of claim 5, wherein said first contact pad is ball bonded to said top portion of said conducting via; and said second contact pad is ball bonded to said bottom portion of said conducting via.

8. An electronic assembly, comprising: a carrier wafer of a first material, having a top wafer surface and a bottom wafer surface; said carrier wafer comprising a through-wafer cavity having walls that join said top wafer surface to said bottom wafer surface; and an insulator of a second material, different from the first material, having insulator top and bottom surfaces, joined by insulator side surfaces, and having a conducting via that passes through said insulator between said insulator top surface and said insulator bottom surface; wherein the insulator is held in said through-wafer cavity by direct contact of the insulator side surfaces with an attachment metal that fills said through-wafer cavity, wherein the insulator is thicker than the carrier wafer, the top surface of the insulator and the carrier wafer being flush and the bottom surface of the insulator protruding out of the bottom surface of the carrier wafer, and wherein said attachment metal further covers at least a portion of the bottom surface of the carrier wafer around the through-wafer cavity.

9. An electronic assembly, comprising: a carrier wafer of a first material, having a top wafer surface and a bottom wafer surface; said carrier wafer comprising a through-wafer cavity having walls that join said top wafer surface to said bottom wafer surface; and an insulator of a second material, different from the first material, having insulator top and bottom surfaces, joined by insulator side surfaces, and having a conducting via that passes through said insulator between said insulator top surface and said insulator bottom surface; wherein the insulator is held in said through-wafer cavity by direct contact of the insulator side surfaces with an attachment metal that fills said through-wafer cavity, the electronic assembly further comprising a component chip having a top surface and a bottom surface joined by chip side surfaces, said component chip being held in a second through-wafer cavity by direct contact of said chip side surface with a second attachment metal filling said second through-wafer cavity.

* * * * *